United States Patent
Tabata et al.

(10) Patent No.: US 9,088,270 B2
(45) Date of Patent: *Jul. 21, 2015

(54) CAPACITIVE LOAD DRIVE CIRCUIT, FLUID EJECTION DEVICE AND MEDICAL DEVICE

(71) Applicant: SEIKO EPSON CORPORATION, Tokyo (JP)

(72) Inventors: Kunio Tabata, Shiojiri (JP); Atsushi Oshima, Shiojiri (JP); Hiroyuki Yoshino, Suwa (JP); Noritaka Ide, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/282,789

(22) Filed: May 20, 2014

(65) Prior Publication Data

US 2014/0253187 A1 Sep. 11, 2014

Related U.S. Application Data

(63) Continuation of application No. 13/420,679, filed on Mar. 15, 2012, now Pat. No. 8,773,098.

(30) Foreign Application Priority Data

Mar. 17, 2011 (JP) ................. 2011-059041

(51) Int. Cl.
*H03K 3/012* (2006.01)
*H02M 3/156* (2006.01)
*B41J 2/045* (2006.01)
*H02M 3/157* (2006.01)

(52) U.S. Cl.
CPC ............ *H03K 3/012* (2013.01); *B41J 2/04541* (2013.01); *B41J 2/04581* (2013.01); *H02M 3/156* (2013.01); *H02M 3/157* (2013.01)

(58) Field of Classification Search
USPC ............. 323/271, 282–290; 327/111; 347/10
See application file for complete search history.

(56) References Cited

U.S. PATENT DOCUMENTS

| 6,815,939 | B2 | 11/2004 | Umemoto et al. |
| 7,244,007 | B2 | 7/2007 | Ishizaki |
| 7,571,989 | B2 | 8/2009 | Ishizaki |

(Continued)

FOREIGN PATENT DOCUMENTS

| JP | 2005-329710 A | 12/2005 |
| JP | 2007-168172 A | 7/2007 |

(Continued)

*Primary Examiner* — Jessica Han
(74) *Attorney, Agent, or Firm* — R. Burns Israelsen

(57) ABSTRACT

Operation of a digital power amplifier for power amplification of a modulated signal is stopped in a period in which a voltage value of a drive signal applied to a capacitive load is constant, to thereby suppress power loss. The power amplification is stopped either when half a period of time when the modulated signal in a first voltage state maintains the first voltage state elapses or when half a period of time when the modulated signal in a second voltage state which is lower in voltage than the first voltage state maintains the second voltage state elapses. Accordingly, when electric current does not flow in a inductor of a low pass filter, it is possible to stop the power amplification. Thus, it is possible to prevent generation of voltage fluctuation in the drive signal due to an electromotive force caused by a self-induction phenomenon of the inductor.

5 Claims, 11 Drawing Sheets

(56) References Cited

U.S. PATENT DOCUMENTS

| | | |
|---|---|---|
| 7,748,812 B2 | 7/2010 | Oshima |
| 7,850,265 B2 * | 12/2010 | Ishizaki ............................ 347/9 |
| 8,109,587 B2 | 2/2012 | Ishizaki |
| 8,398,194 B2 | 3/2013 | Yoshino et al. |
| 8,848,331 B2 * | 9/2014 | Iwasa et al. .................. 361/111 |
| 2008/0018686 A1 | 1/2008 | Oshima et al. |
| 2009/0167798 A1 | 7/2009 | Ide et al. |
| 2009/0213152 A1 | 8/2009 | Tabata et al. |
| 2009/0303271 A1 | 12/2009 | Tabata et al. |
| 2010/0026267 A1 | 2/2010 | Easwaran et al. |
| 2010/0328379 A1 | 12/2010 | Tabata et al. |
| 2011/0175586 A1 | 7/2011 | Kuo |

FOREIGN PATENT DOCUMENTS

| | | |
|---|---|---|
| JP | 2007-190708 A | 8/2007 |
| JP | 2008-049698 A | 3/2008 |
| JP | 2008-148288 A | 6/2008 |
| JP | 2009-154311 A | 7/2009 |
| JP | 2009-196198 A | 9/2009 |
| JP | 2010-046989 A | 3/2010 |
| JP | 2011-005733 A | 1/2011 |
| WO | 2007/072945 A1 | 6/2007 |

\* cited by examiner

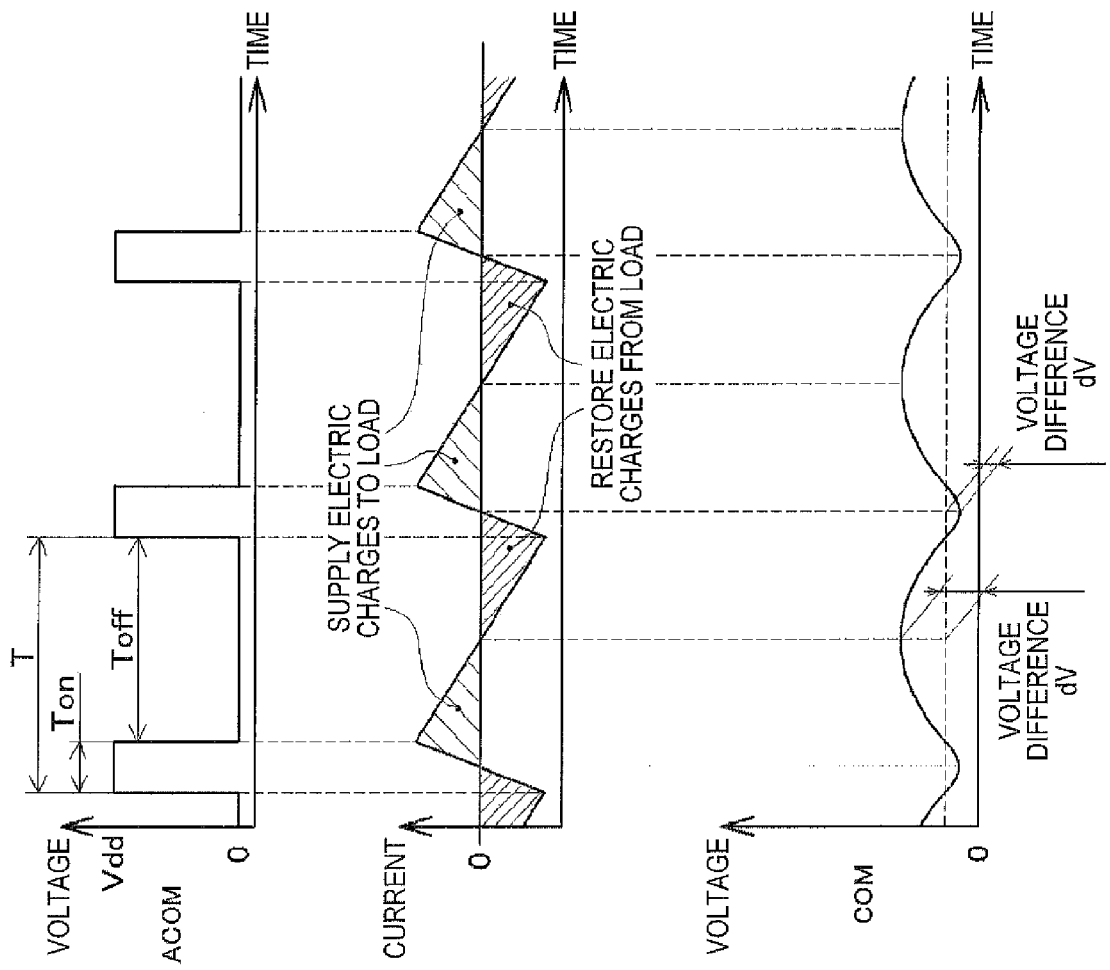

CAPACITIVE LOAD DRIVE CIRCUIT, FLUID EJECTION DEVICE AND MEDICAL DEVICE

CROSS REFERENCE TO RELATED APPLICATION

This application is a Continuation of U.S. application Ser. No. 13/420,679 filed Mar. 15, 2012 which claims priority to Japanese Patent Application No. 2011-059041 filed on Mar. 17, 2011. The foregoing patent applications are incorporated herein by reference.

BACKGROUND

1. Technical Field

The present invention relates to a technique which applies a drive signal to drive a capacitive load such as a piezoelectric element.

2. Related Art

Most of piezoelectric elements are driven by a predetermined drive signal applied thereto, as in an ejection head which is mounted to an ink jet printer, or the like. In general, such a piezoelectric element is driven by a drive signal generated by power-amplifying a drive waveform signal.

As a method of generating the drive signal by power-amplifying the drive waveform signal, a method of using a digital power amplifier has been proposed which is different from a method of using an analog power amplifier. The method of using the digital power amplifier can perform the power amplification with small power loss and can be easily made smaller, compared with the method of using an analog power amplifier (for example, JP-A-2005-329710). In order to generate the drive signal using the digital power amplifier, firstly, the drive wavelength signal is pulse-modulated to be converted into a modulated signal of a pulse waveform. Then, the obtained modulated signal is power-amplified by the digital power amplifier to be converted an amplified digital signal. Thereafter, modulated components included in the amplified digital signal are removed by a low pass filter, to thereby generate the power-amplified drive signal.

Further, most of drive signals include a period in which a voltage value is not changed. Since the piezoelectric element to which the drive signal is applied is a capacitive load, it is not necessary to supply electric power in the period in which the voltage value of the drive signal is not changed. In other words, operation of the digital power amplifier in this period becomes wasteful. In this regard, a technique has been proposed in which the operation of the digital power amplifier is stopped in the period in which the voltage value of the drive signal is not changed to further reduce power loss in generation of the drive signal (JP-A-2011-005733).

However, the previously proposed technique has a problem that the voltage value of the drive signal may be changed when the operation of the digital power amplifier is stopped. If the voltage value is changed in the period in which the voltage value of the drive signal should be constant, it is difficult to drive the capacitive load such as a piezoelectric element with high accuracy.

SUMMARY

An advantage of some aspects of the invention is to provide a technique which is capable of stopping operation of a digital power amplifier without changing a voltage value of a drive signal in a period in which the voltage value is to be a constant value to drive a capacitive load with high accuracy and to effectively reduce power loss.

An aspect of the invention is directed to a capacitive load drive circuit which applies a predetermined drive signal to drive a capacitive load, including: a drive waveform generator which generates a drive waveform signal which is a reference of the drive signal; a modulator which pulse-modulates the drive waveform signal to generate a modulated signal in which a first voltage state and a second voltage state which is lower in voltage than the first voltage state are repeated; a digital power amplifier which power-amplifies the modulated signal to generate an amplified digital signal; a low pass filter which smoothes the amplified digital signal to generate the drive signal to be applied to the capacitive load; and a power amplification stopping section which stops operation of the digital power amplifier in a signal invariable period which is a period in which the drive waveform signal is to be a constant value, wherein in the signal invariable period, a power amplification stopping section stops an operation of the digital power amplifier, either when half a period of time when the modulated signal in the first voltage state maintains the first voltage state elapses or when half a period of time when the modulated signal in the second voltage state maintains the second voltage state elapses.

In this capacitive load drive circuit, the drive waveform signal generated in the drive waveform signal generation circuit may be pulse-modulated to be converted into the modulated signal. Further, the modulated signal is power-amplified and is then smoothed by the low pass filter, to thereby generate the drive signal. Here, in the capacitive load such as a piezoelectric element, voltage in which the load corresponds to an accumulated electric charge amount is expressed as voltage between terminals. Thus, when the voltage value of the applied drive signal is not changed, even though the capacitive load is separated from the drive circuit, the capacitive load is maintained in a state where the drive signal is applied. Thus, in the period in which the voltage value of the drive signal is not changed (that is, in the signal invariable period in which the voltage value of the drive waveform signal is not changed), the power amplification in the digital power amplifier is stopped at the following timing. That is, the power amplification in the digital power amplifier is stopped either at a timing when half the period of time when the modulated signal in the first voltage state maintains the first voltage state elapses or at a timing when half the period of time when the modulated signal in the second voltage state maintains the second voltage state elapses.

Although described later in detail, the inventors of the present application have found that the phenomenon that voltage fluctuation overlaps with the drive signal when the power amplification in the digital power amplifier is stopped is caused by the fact that electric current flows in the low pass filter even in the period (signal invariable period) in which the voltage value of the drive signal is constant. Further, in the signal invariable period, the electric current flowing in the low pass filter becomes zero either when half the period of time when the modulated signal in the first voltage state maintains the first voltage state elapses or when half the period of time when the modulated signal in the second voltage state maintains the second voltage state elapses. Thus, if the operation of the digital power amplifier is stopped at this time (or in the vicinity of this time), it is possible to stop the power amplification of the digital power amplifier without generation of the voltage fluctuation in the drive signal, and to avoid generation of power loss according to the power amplification.

Further, in the capacitive load drive circuit of the invention as described above, whether the operation of the digital power amplifier is stopped when half the period of time when the modulated signal in the first voltage state maintains the first voltage state elapses or when half the period of time when the modulated signal in the second voltage state maintains the second voltage state elapses may be determined according to the following switching. That is, when the signal invariable period starts, in a case where the period of time when the modulated signal maintains the second voltage state is longer than the period of time when the modulated signal maintains the first voltage state, the operation of the digital power amplifier is stopped when half the period of time when the modulated signal in the first voltage state maintains the first voltage state elapses. On the other hand, when the signal invariable period starts, in a case where the period of time when the modulated signal maintains the second voltage state is shorter than the period of time when the modulated signal maintains the first voltage state, the operation of the digital power amplifier may be stopped when half the period of time when the modulated signal in the second voltage state maintains the second voltage state elapses.

Since electric current flows in the low pass filter even in the signal invariable period, strictly speaking, the voltage value of the drive signal applied to the capacitive load is changed. Further, if the power amplification in the digital power amplifier is stopped in the signal invariable period, strictly, the drive signal of which the voltage value is changed is fixed at a voltage value at that time point. The voltage value fixed in this way does not necessarily coincide with a voltage value to be applied to the capacitive load according to the drive waveform signal, which causes a voltage difference. This voltage difference is changed as follows, according to conditions when the power amplification in the digital power amplifier is stopped (when the signal invariable period starts). That is, in a case where the signal invariable period starts under the condition that the period of time when the modulated signal maintains the second voltage state is longer than the period of time when the modulated signal maintains the first voltage state, the voltage difference at the time point when half the period of time when the modulated signal maintains the first voltage state elapses becomes smaller than the voltage difference at the time point when half the period of time when the modulated signal maintains the second voltage state elapses. Reversely, in a case where the signal invariable period starts under the condition that the period of time when the modulated signal maintains the second voltage state is shorter than the period of time when the modulated signal maintains the first voltage state, the voltage difference at the time point when half the period of time when the modulated signal maintains the second voltage state elapses becomes smaller than the voltage difference at the time point when half the period of time when the modulated signal maintains the first voltage state elapses. Thus, when the signal invariable period starts, in a case where the period of time when the modulated signal maintains the second voltage state is longer than the period of time when the modulated signal maintains the first voltage state, by stopping the operation of the digital power amplifier at the time point when half the period of time when the modulated signal maintains the first voltage state elapses, and reversely, in a case where the period of time when the modulated signal maintains the second voltage state is shorter than the period of time when the modulated signal maintains the first voltage state, by stopping the operation of the digital power amplifier at the time point when half the period of time when the modulated signal maintains the second voltage state elapses, it is possible to apply a drive signal having a small voltage difference with respect to the voltage value to be applied to the capacitive load.

Further, the capacitive load drive circuit of the invention as described above may be mounted to a fluid ejection device.

With this configuration, it is possible to suppress loss of electric power for driving the fluid ejection device. Further, since the voltage fluctuation does not overlap with the drive signal, it is possible to eject a fluid with high accuracy.

BRIEF DESCRIPTION OF THE DRAWINGS

The invention will be described with reference to the accompanying drawings, wherein like numbers reference like elements.

FIGS. 8A to 8C are diagrams illustrating inductor current under the condition that the duty ratio of a modulated signal is 50% or less and a drive signal applied to a piezoelectric element.

DESCRIPTION OF EXEMPLARY EMBODIMENTS

Hereinafter, embodiments will be described in the following order, for clarification of the content of the invention.

Figure 1:
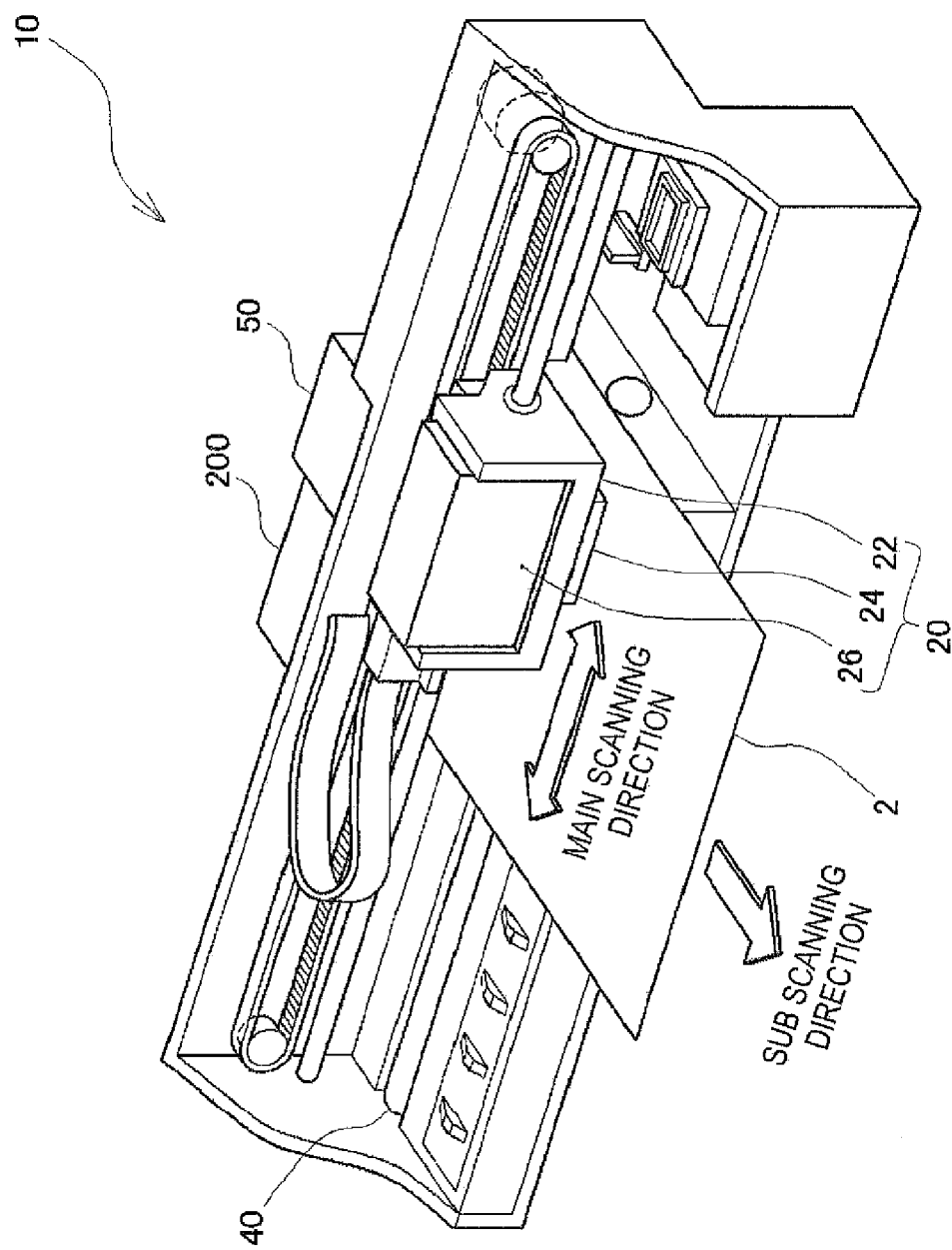
FIG. 1 is a diagram illustrating an ink jet printer on which a capacitive load drive circuit according to an embodiment of the invention is mounted.

A. Device configuration
A-1. Overall configuration
A-2. Outline of capacitive load drive circuit
B. Mechanism of stopping power amplification without change in voltage of drive signal
C. Enabling signal output process
A. Device Configuration FIG. 1 is a diagram illustrating an ink jet printer 10 on which a capacitive load drive circuit 200 of an embodiment of the invention is mounted. The ink jet printer 10 shown in FIG. 1 includes a carriage 20 which forms ink dots on a printing medium 2 while reciprocating in a main scanning direction, a drive mechanism which reciprocates the carriage 20, a platen roller 40 for feeding the printing medium 2, and the like. The carriage 20 is provided with an ink cartridge 26 which contains ink, a carriage case 22 in which the ink cartridge 26 is installed, an ejection head 24 which is mounted on a bottom surface side (side which faces the printing medium 2) of the carriage case 22 and ejects ink, and the like. The carriage 20 guides the ink in the ink cartridge 26 to the ejection head 24 and ejects the ink from the ejection head 24 to the printing medium 2 to thereby print an image. The platen roller 40 forms a paper feeding mechanism which feeds the printing medium 2 in cooperation with a drive motor or gear mechanism (not shown). Further, the ink jet printer 10 is mounted with a printer control circuit 50 which controls an overall operation, and the capacitive load drive circuit 200 for driving the ejection head 24.

Figure 2:
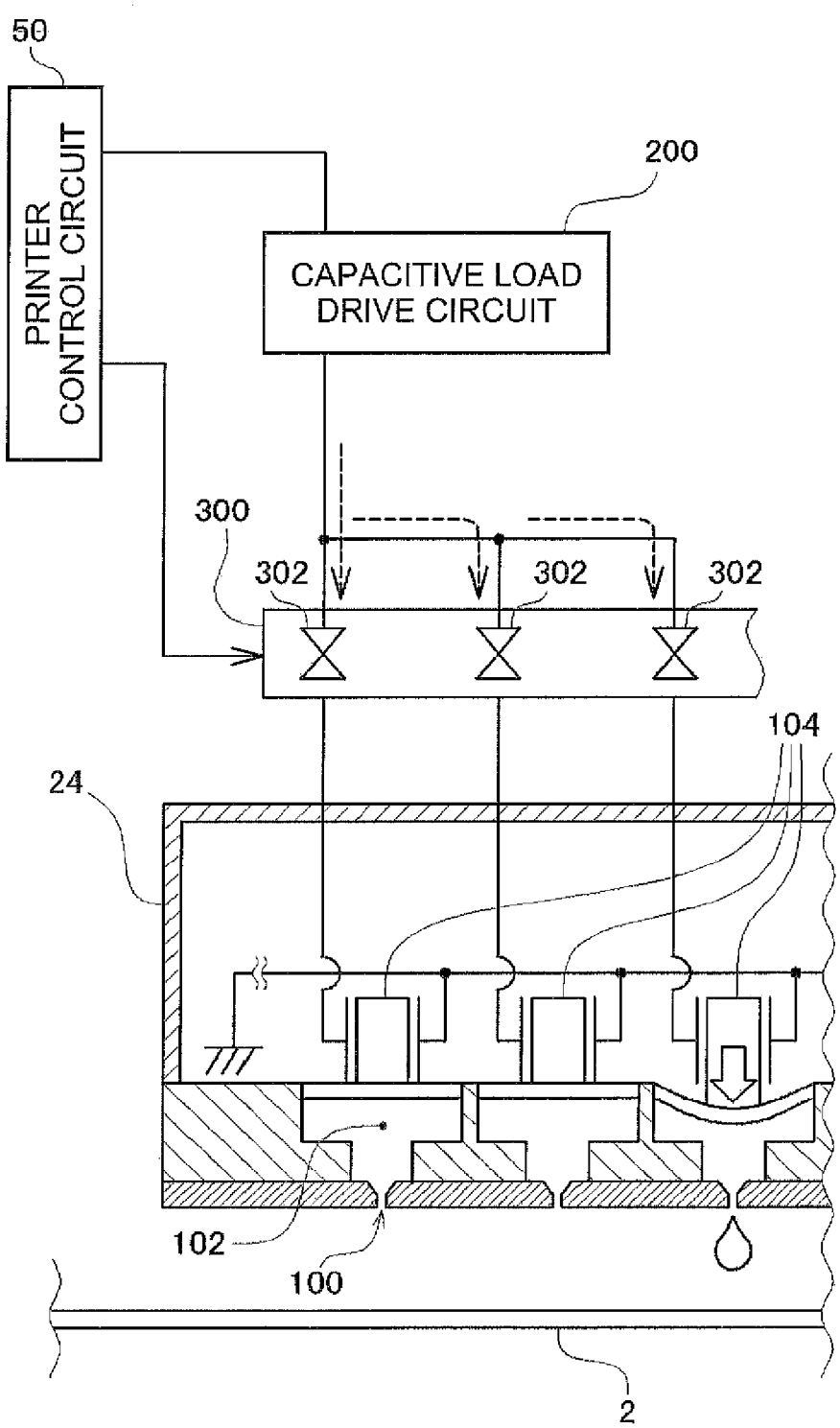
FIG. 2 is a diagram illustrating a state where a capacitive load drive circuit drives an ejection head under the control of a printer control circuit.

FIG. 2 is a diagram illustrating a state where the capacitive load drive circuit 200 drives the ejection head 24 under the control of the printer control circuit 50. Firstly, an internal structure of the ejection head 24 will be briefly described. As shown in the figure, on the bottom surface (surface which faces the printing medium 2) of the ejection head 24, a plurality of ejection nozzles 100 which ejects ink drops is disposed. The ejection nozzles 100 are connected to an ink chamber 102, and the ink chamber 102 is supplied with ink from the ink cartridge 26. A piezoelectric element 104 is disposed for each ink chamber 102. If a drive signal (hereinafter, simply referred to as COM) is applied to the piezoelectric element 104, the piezoelectric element is deformed to press ink in the ink chamber 102, and as a result, ink is ejected from the ejection nozzle 100. In the present embodiment, the piezoelectric element 104 corresponds to the "capacitive load" in the invention.

COM (drive signal) applied to the piezoelectric element 104 is generated by the capacitive load drive circuit 200, and is supplied to the piezoelectric element 104 through a gate unit 300. The gate unit 300 is a circuit unit in which a plurality of gate elements 302 is connected in parallel with each other. Each gate element 302 is able to be individually in a conduction state or a cut-off state under the control of the printer control circuit 50. Accordingly, COM output from the capacitive load drive circuit 200 passes through only the gate element 302 which is set to the conduction state in advance by the printer control circuit 50 and is applied to the piezoelectric element 104 corresponding thereto, to thereby eject ink from the ejection nozzle 100.

A-2. Outline of Capacitive Load Drive Circuit

Figure 3:
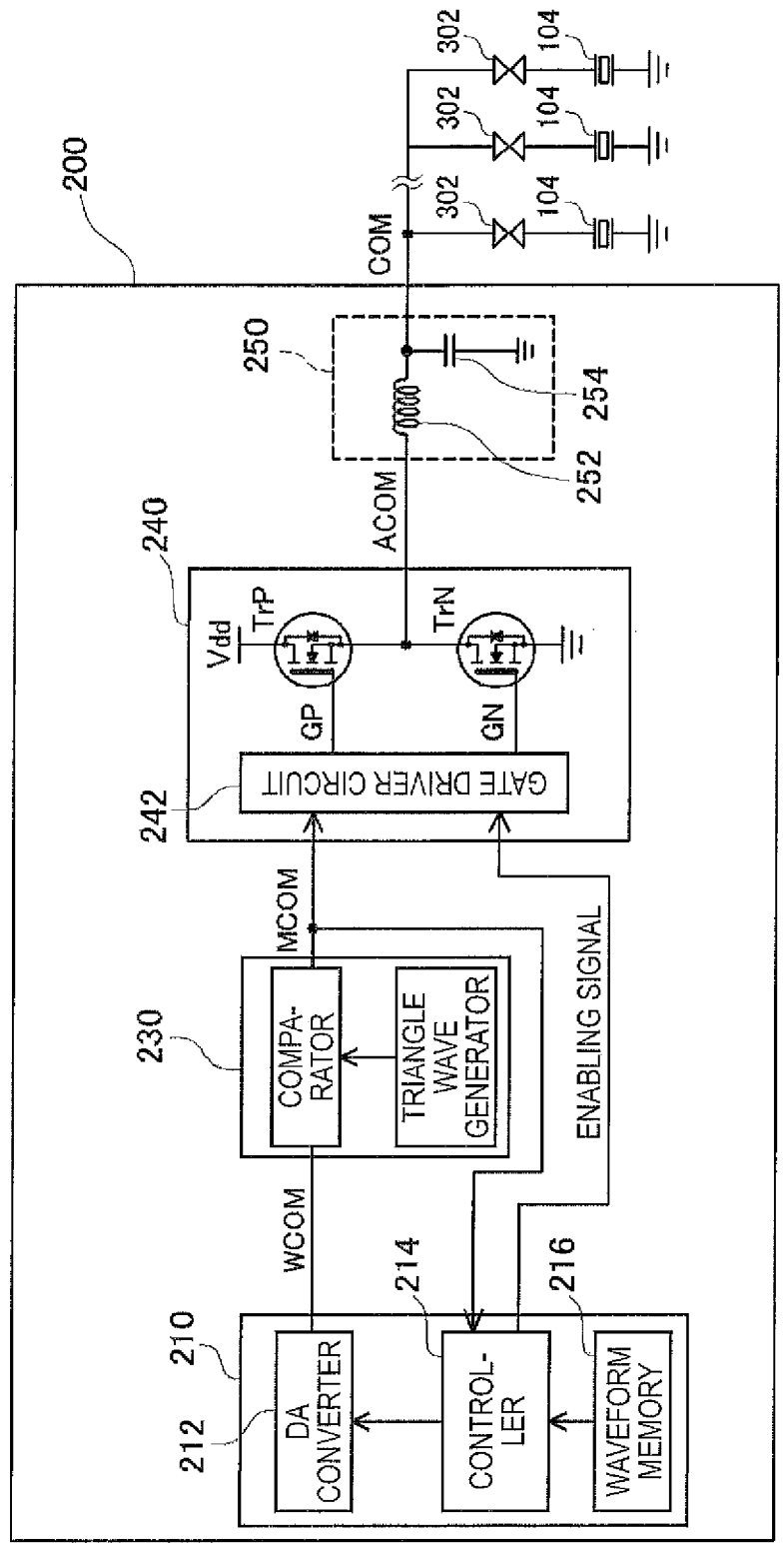
FIG. 3 is a diagram illustrating a detailed configuration of a capacitive load drive circuit.

FIG. 3 is a diagram illustrating a circuit configuration of the capacitive load drive circuit 200 according to the present embodiment. The capacitive load drive circuit 200 includes a drive waveform generator 210 which generates a drive waveform signal (hereinafter, referred to as WCOM) which becomes a reference of the drive signal (COM), a modulator 230 which pulse-modulates WCOM to generate a modulated signal (hereinafter, referred to as MCOM), a digital power amplifier 240 which power-amplifies MCOM to generate an amplified digital signal (hereinafter, referred to as ACOM), and a low pass filter 250 which smoothes ACOM to generate the COM.

Here, the drive waveform signal generation circuit 210 includes a waveform memory 216 which stores digital data on the drive waveform signal, a controller 214 which reads the digital data in the waveform memory 216, and a D/A converter 212 which receives the digital data read by the controller 214 and performs digital/analog conversion to generate an analog WCOM, and the like. Further, the controller 214 according to the present embodiment generates an enabling signal for designating whether to perform power amplification and outputs the generated enabling signal to the digital power amplifier 240. A process of generating the enabling signal by the controller 214 will be described later.

The modulator 230 is provided with a triangle wave generator which generates a triangle wave of a predetermined frequency (carrier frequency), and a comparator. Further, the modulator 230 compares the triangle wave with WCOM from the drive waveform signal generation circuit 210 to perform the pulse modulation of WCOM, and outputs the obtained modulated signal (MCOM) to the digital power amplifier 240. MCOM is a signal which becomes a high voltage state (first voltage state) (hereinafter, referred to as "1") in a period in which WCOM is larger than the triangle wave, and contrarily, becomes a low voltage state (second voltage state) (hereinafter, referred to as "0") in a period in which WCOM is smaller than the triangle wave.

The digital power amplifier 240 is provided with two switch elements (MOSFET or the like) which are connected in push-pull between a power source Vdd and the ground, and a gate driver 242 which drives these switch elements. Among two switch elements, the switch element connected to the power source Vdd is represented as "TrP", and the switch element connected to the ground is represented as "TrN". Further, it is assumed that the power source Vdd generates voltage Vdd and voltage of the ground is 0.

The gate driver 242 outputs two gate signals GP and GN, in which the gate signal GP is connected to a gate electrode of the switch element TrP and the gate signal GN is connected to a gate electrode of the switch element TrN. Thus, as outputs of the gate signals GP and GN are set to any one of a high voltage state (hereinafter, referred to as "1") or a low voltage state (hereinafter, referred to as "0"), the switch elements TrP and TrN are able to be individually switched to any one of the conduction state (ON state) or the cut-off state (OFF state). As a result, for example, if the switch element TrP is set to the ON state and the switch element TrN is set to the OFF state, the voltage Vdd generated by the power source Vdd is supplied to the low pass filter 250 as an output of the digital power amplifier 240. Contrarily, if the switch element TrP is set to the OFF state and the switch element TrN is set to the ON state, the voltage "0" of the ground is supplied to the low pass filter 250 as an output of the digital power amplifier 240.

Further, MCOM from the modulator 230 and the enabling signal from the controller 214 are input to the gate driver 242. Further, in a case where the output of the enabling signal is in an operation enable state (in the present embodiment, state where the output is "1"), the gate signals GP and GN are output on the basis of MCOM to control the switch elements TrP and TrN. As a result, when MCOM is in the high voltage state (output "1"), the voltage Vdd is output, and when MCOM is in the low voltage state (output "0"), the voltage "0" is output, to perform power amplification of MCOM. On the other hand, in a case where the output of the enabling signal is in an operation non-enable state (in the present embodiment, state where the output is "0"), the outputs of the gate signals GP and GN are set to "0" regardless of MCOM, to thereby switch all the switch elements TrP and TrN to the OFF state. As a result, the power amplification in the digital power amplifier 240 is stopped.

ACOM obtained by power-amplifying MCOM as described above is supplied to the low pass filter 250. The low pass filter 250 includes a inductor 252 and a capacitor 254, and significantly attenuates the signal component of frequencies higher than a cut-off frequency fc determined by inductance L of the inductor 252 and capacitance C of the capacitor 254. Thus, by supplying ACOM to the low pass filter 250, a carrier frequency component included in ACOM is attenuated to thereby extract a component of COM. The obtained COM in this way is applied to the piezoelectric element 104 through the gate element 302.

Figure 4:
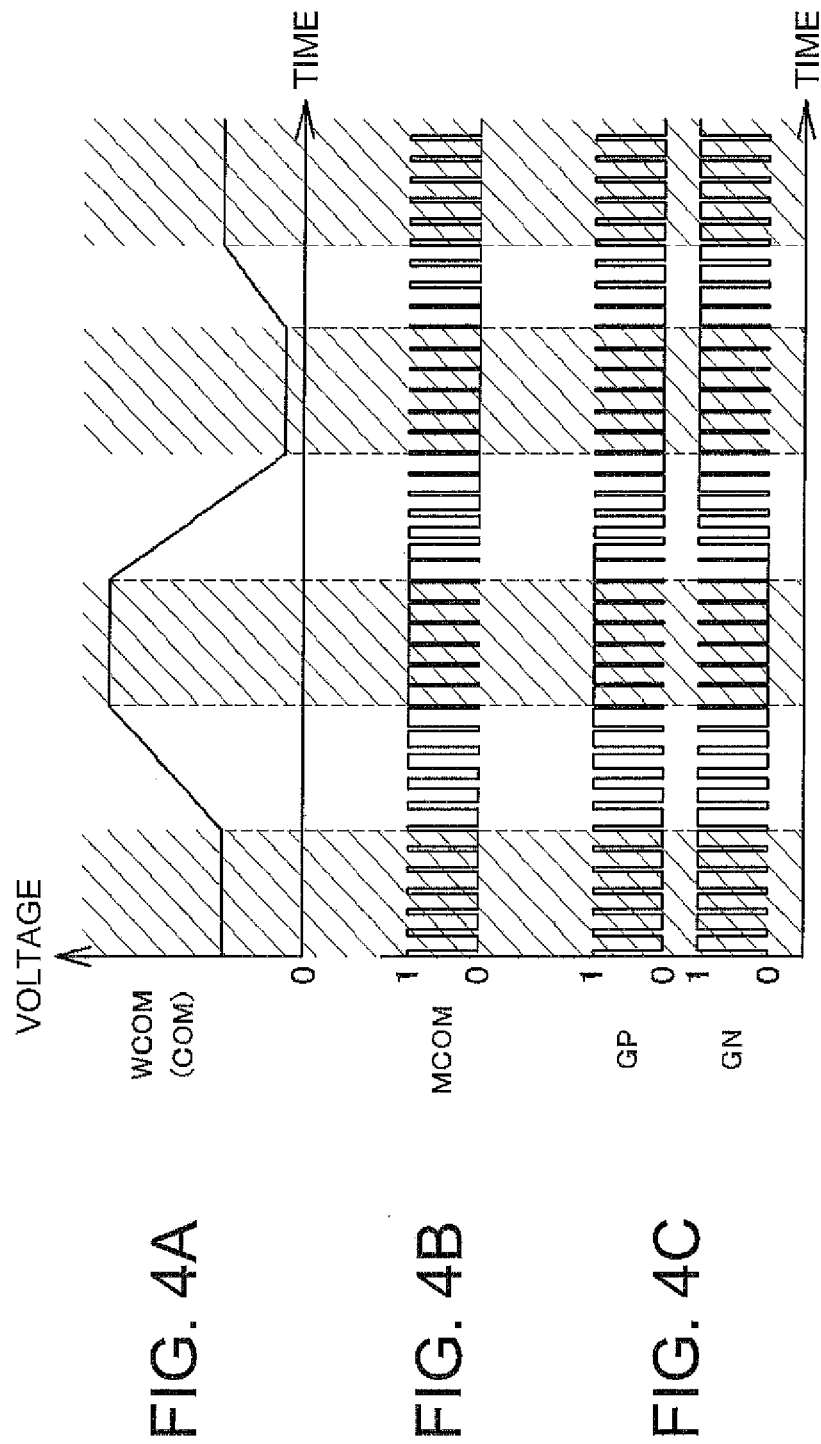
FIGS. 4A to 4C are diagrams illustrating a state where a digital power amplifier is operated on the basis of a modulated signal (MCOM).

FIGS. 4A to 4C are diagrams illustrating a state where the gate driver 242 of the digital power amplifier 240 switches the ON and OFF states of two switch elements TrP and TrN according to MCOM. FIG. 4A to 4C show a case where the ON and OFF states of two switch elements TrP and TrN are switched according to MCOM even in a case where WCOM (accordingly, COM) is not changed. FIG. 4A shows WCOM generated by the drive waveform signal generation circuit 210, and FIG. 4B shows MCOM generated by pulse-modulating WCOM by the modulator 230. Further, FIG. 4C shows the gate signals GP and GN which are output by the gate driver 242 of the digital power amplifier 240 according to MCOM.

As shown in the figures, the gate driver 242 sets the output of the gate signal GP to "1" and sets the output of the gate signal GN to "0" when the output of MCOM is "1". Further, the gate driver 242 sets the output of the gate signal GP to "0" and sets the output of the gate signal GN to "1" when the output of MCOM is "0". As a result, MCOM is amplified to ACOM which is changed between the voltage (voltage Vdd) of the power source Vdd and the ground voltage (voltage 0), to then be output to the low pass filter 250. Further, by smoothing ACOM by the low pass filter 250, it is possible to apply COM obtained by power-amplifying WCOM to the piezoelectric element 104.

Here, since the piezoelectric element 104 is a capacitive load, the application of the voltage to the piezoelectric element 104 simply means that an electric charge amount corresponding to the voltage is stored in the piezoelectric element 104. Accordingly, when the applied voltage value becomes a constant value, it is not necessary to allow electric current to flow in the piezoelectric element 104 to take in and out electric charges. Thus, in a period in which WCOM (accordingly, COM) is not changed (signal invariable period), such as periods indicated by oblique lines in FIG. 4A to 4C, the switching of the ON and OFF states of the switch elements TrP and TrN is wasteful. In other words, in a signal invariable period, if the gate signals GP and GN are set to the OFF state and the power amplification in the digital power amplifier 240 is stopped, it is possible to suppress power loss due to the switching of the ON and OFF states of the switch elements TrP and TrN.

Figure 5:
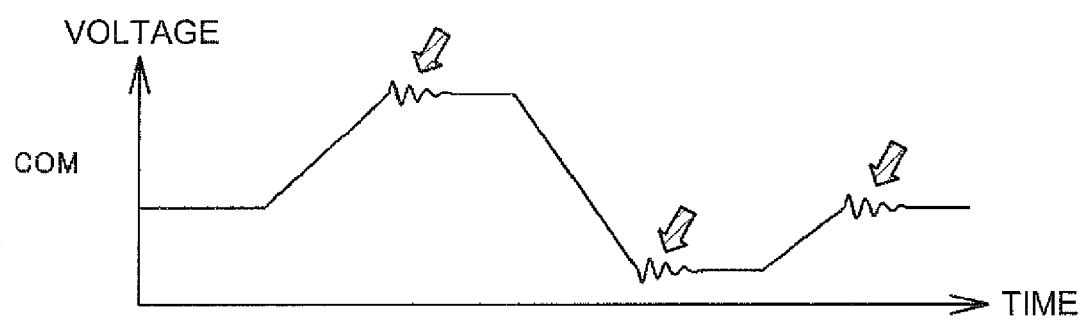
FIG. 5 is a diagram illustrating a state where a voltage value is changed in a drive signal when operation of a digital power amplifier is stopped in a signal invariable period.

However, in reality, if the power amplification is stopped in the signal invariable period, as shown in FIG. 5, a phenomenon that the voltage value of COM is changed occurs. Since the signal invariable period is a period in which COM of a constant voltage value is to be output, if the output voltage value is changed, it is not possible to drive the piezoelectric element 104 with high accuracy. Thus, in the capacitive load drive circuit 200 according to the present embodiment, the operation of the digital power amplifier 240 is stopped by the following method in the signal invariable period in which the voltage value of COM becomes the constant value, to thereby prevent the voltage fluctuation.

B. Mechanism of Stopping Power Amplification without Change in Voltage of Drive Signal In order to describe the method of stopping the operation of the digital power amplifier 240 without generating the voltage fluctuation, a mechanism which causes the phenomenon as shown in FIG. 5 when the operation of the digital power amplifier 240 is stopped will be described.

Firstly, in general, electric current (hereinafter, inductor current) occurring in the inductor 252 of the low pass filter 250 in a case where voltage E is applied to the low pass filter 250 or voltage 0 is applied thereto will be described. If the voltage Vdd is replaced with the voltage E in the repetition of the voltage Vdd and the ground voltage 0, the output (ACOM) of the digital power amplifier 240 in the present embodiment may be applied to the low pass filter 250 in the present embodiment as it is.

Figures 6A, 6B:
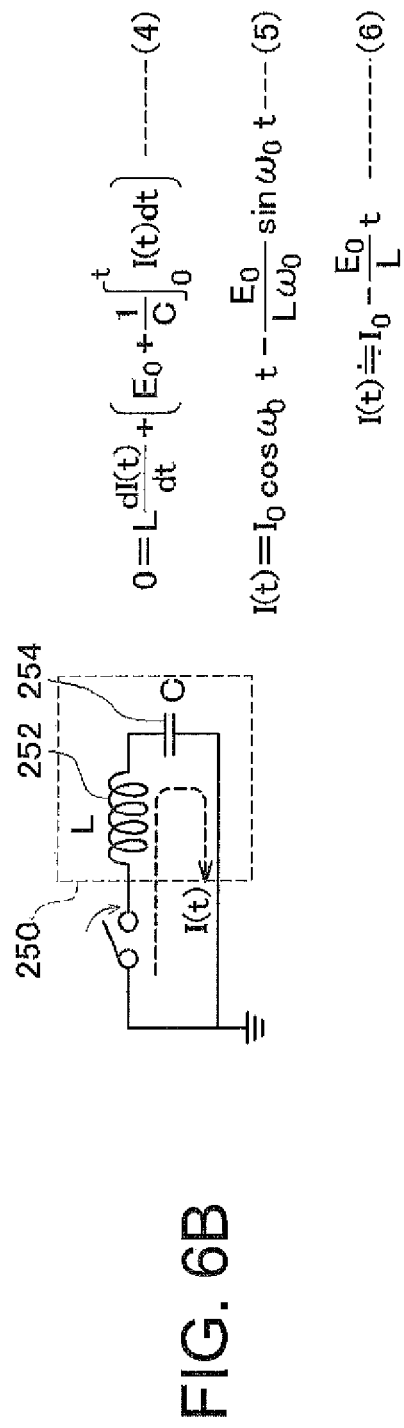
FIGS. 6A and 6B are diagrams illustrating an approximation formula of inductor current of a low pass filter.

A inductor current I in a case where the voltage E is applied to the low pass filter 250 is the same as a inductor current I flowing in the inductor 252 when a switch is closed in a circuit shown in FIG. 6A. When inductance of the inductor 252 is represented as L, capacitance of the capacitor 254 is represented as C, an initial current flowing in the inductor 252 (inductor current flowing right before the voltage E is applied) is represented as $I_0$, and an initial voltage of the capacitor 254 (inter-terminal voltage of the capacitor 254 right before the voltage E is applied) is represented as $E_0$, a differential equation expressed by formula (1) in FIG. 6A is established between the voltage E and the inductor current I. Further, if this equation is reduced, the inductor current I is calculated by formula (2) shown in FIG. 6A. Here, $\omega_0$ a resonant frequency ($=1/\sqrt{(LC)}$) of the low pass filter 250. Further, in a case where the product $\omega_0 t$ of resonant frequency $\omega_0$ and time t is sufficiently small and is close to 0, $\cos \omega_0 t$ can be considered as approximately 1, and $\sin \omega_0 t$ can be considered as approximately $\omega_0 t$. Then, formula (2) in FIG. 6A can be approximated as formula (3) in FIG. 6A, and thus, it can be understood that the inductor current I is linearly increased as time t elapses. The inductor current I becomes a positive value in a case where electric current flows to the capacitor 254 from the inductor 252. Further, the inductor current I becomes a negative value in a case where electric current flows to the inductor 252 from the capacitor 254.

This is similarly applied to a case where the voltage 0 is applied to the low pass filter 250. That is, the inductor current I in a case where the voltage 0 is applied to the low pass filter 250 is the same as a inductor current I flowing in the inductor 252 when the switch is closed in a circuit shown in FIG. 6B. Since the voltage 0 is applied to the inductor 252, a differential equation shown in formula (4) in FIG. 6B is established with respect to the inductor current I. Further, if this equation is reduced, the inductor current I when the voltage output to the low pass filter 250 is set to the voltage 0 is calculated by formula (5) shown in FIG. 6B. Further, if $\cos \omega_0 t$ is considered as 1 and $\sin \omega_0 t$ is considered as $\omega_0 t$, the inductor current I can be approximated as formula (6) in FIG. 6B. Accordingly, the inductor current I is linearly decreased as time t elapses in a period in which the voltage output to the low pass filter 250 is the voltage 0.

Figure 7:
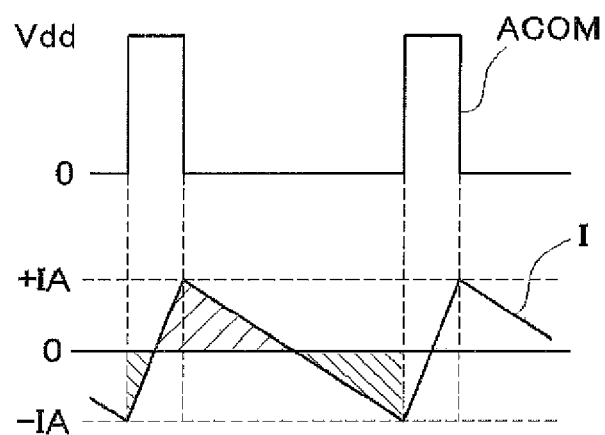
FIG. 7 is a diagram illustrating inductor current of a low pass filter in a signal invariable period.

FIG. 7 is a diagram illustrating a state where the inductor current I flows in the inductor 252 of the low pass filter 250 when ACOM changed between the voltage Vdd and the voltage 0 is output to the low pass filter 250. In a period in which the voltage value of ACOM is the voltage Vdd, as described above with reference to FIG. 6A, the inductor current I of the inductor 252 is approximately linearly increased. Further, in a period in which the voltage value of ACOM is the voltage 0, as described above with reference to FIG. 6B the inductor current I of the inductor 252 is approximately linearly decreased. Accordingly, as ACOM from the digital power amplifier 240 is supplied, the inductor current I of a sawtooth shape flows in the inductor 252 of the low pass filter 250 such that ACOM is linearly increased in the period in which ACOM is the voltage Vdd and is linearly decreased in the period in which ACOM is the voltage 0.

Further, in a period in which WCOM is not changed, the voltage value of COM output from the low pass filter 250 becomes a constant value. Further, in a case where an electric load driven by COM is a capacitive load such as a piezoelectric element or a capacitor, the fact that COM is the constant value means that the amount of electric charges stored in the capacitive load is constant, and thus, in the period of a cycle T of pulse modulation, electric charges flowing into and out of the capacitive load become equivalent. Accordingly, the area of a portion indicated by a rough oblique line in FIG. 7 (corresponding to the amount of electric charges supplied to the capacitive load) and the area of portions indicated by thin oblique lines (corresponding to the amount of electric charges recovered from the capacitive load) become equal. Thus, in the period in which WCOM is not changed (period in which the voltage value of COM becomes the constant value), the inductor current I flowing in the inductor 252 becomes electric current of a sawtooth shape such that a maximum value on the positive side and a maximum value on the negative side become equal.

In this way, in a case where WCOM is not changed (accordingly, in a case where the voltage value of COM is the constant value), as shown in FIG. 7, the electric current of a sawtooth shape flows in the inductor 252 of the low pass filter 250. Accordingly, in a state where the electric current flows in the inductor 252, if the gate driver 242 suddenly turns off the switch elements TrP and TrN, an electromotive force is generated by the self-induction phenomenon of the inductor 252 at the moment. As a result, the voltage fluctuation of the resonant frequency determined by the inductance L of the inductor 252 and the capacitance C of the capacitor 254 or the capacitive load overlaps with COM. It is considered that the voltage fluctuation occurring in COM, as shown in FIG. 5, when the power amplification of the digital power amplifier 240 is stopped in the period (signal invariable period) in which WCOM is not changed is caused by such a mechanism. Further, at the moment when ACOM is switched to the voltage Vdd from the voltage 0, or is switched to the voltage 0 from the voltage Vdd, since the inductor current I becomes a maximum value, if the power amplification is stopped at that timing, a large voltage fluctuation overlaps with COM.

However, as shown in FIG. 7, in the period in which ACOM is the voltage Vdd, the direction of the inductor current I is switched to the positive side (direction where electric current flows to the capacitor 254 or the capacitive load) from the negative side (direction where electric current flows back from the capacitor 254 or the capacitive load). Accordingly, there is a timing when the inductor current I becomes 0 (or timing when the inductor current I becomes very small) in this process. Similarly, in the period in which ACOM is the voltage 0, the inductor current I is switched to the negative side from the positive side, there is a timing when the inductor current I becomes 0 (or timing when the inductor current I becomes very small) in this process. Further, if the power amplification of the digital power amplifier 240 is stopped at that timing, it is possible to stop the power amplification without causing the voltage fluctuation due to the self-induction phenomenon of the inductor 252 to be overlapped with COM.

FIGS. 8A to 8C are diagrams illustrating a state where the inductor current flowing in the inductor 252 and the voltage value of COM are changed according to the output of ACOM. FIGS. 8A to 8C show a case where a period in which the output of ACOM is the voltage Vdd is shorter than a period in which the output of ACOM is the voltage 0 (a case where a period Ton is half or less of a pulse modulation period T, that is, a case where the duty ratio is 50% or less). With respect to the inductor current, as shown in FIG. 7, the output of ACOM is approximately linearly increased in the period (period Ton) in which the output of ACOM is the voltage Vdd, and is approximately linearly decreased in the period (period Toff) in which the output of ACOM is the voltage 0. Further, since the electric current flows toward the capacitor 254 or the capacitive load when the inductor current is positive, the voltage value of COM is increased little by little, and since the electric current flows out from the capacitor 254 or the capacitive load when the inductor current is negative, the voltage value of COM is decreased little by little. As a result, the voltage value of COM becomes a voltage waveform as shown in FIG. 8C. In FIG. 8C, the voltage fluctuation is exaggerated.

Further, as shown in FIG. 8B, the inductor current flowing in the inductor 252 becomes 0 at an intermediate timing in the period (period Ton) in which the output of ACOM is the voltage Vdd or at an intermediate timing in the period (period Toff) in which the output of ACOM is the voltage 0. Accordingly, at any one timing thereof, if the power amplification in the digital power amplifier 240 is stopped (if one of the switch elements TrP and TrN is turned off), it is possible to maintain COM at the voltage value at that time. Further, a difference dV between the voltage value of the maintained COM and a voltage value which is a target designated by WCOM becomes small when the power amplification is stopped in the period Ton. Accordingly, from the viewpoint that COM is output with high accuracy, in a case where the duty ratio is 50% or less, it can be said that it is preferable to stop the power amplification in the digital power amplifier 240 at the timing when half the period Ton elapses.

Figure 9A:
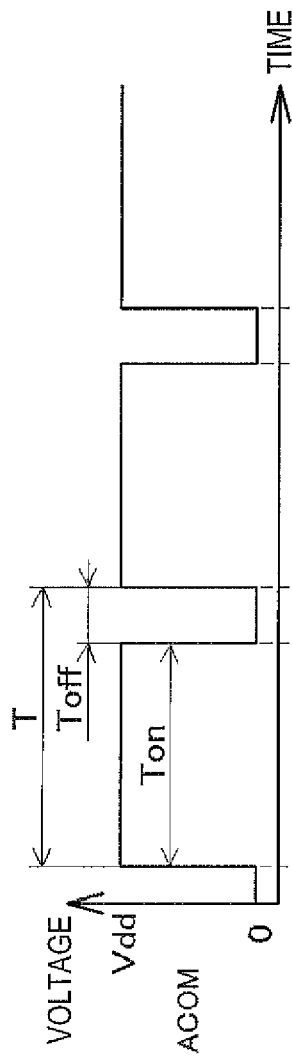
FIGS. 9A to 9C are diagrams illustrating inductor current under the condition that the duty ratio of a modulated signal is 50% or more and a drive signal applied to a piezoelectric element.
Figure 9B:
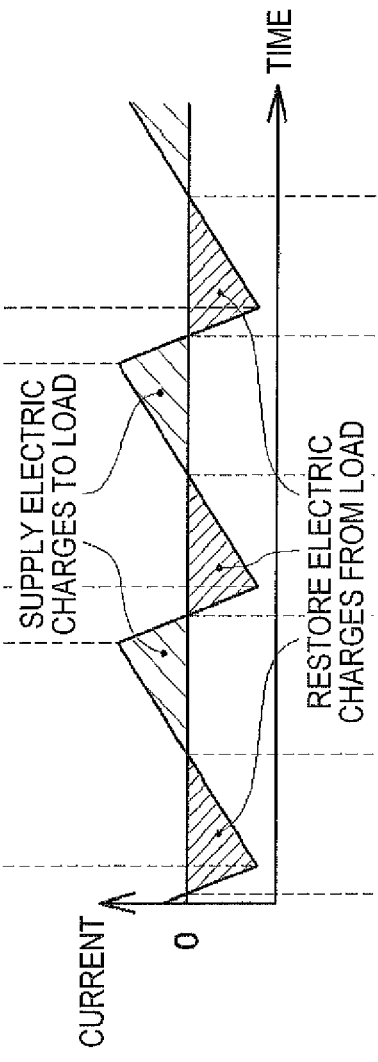
Figure 9C:
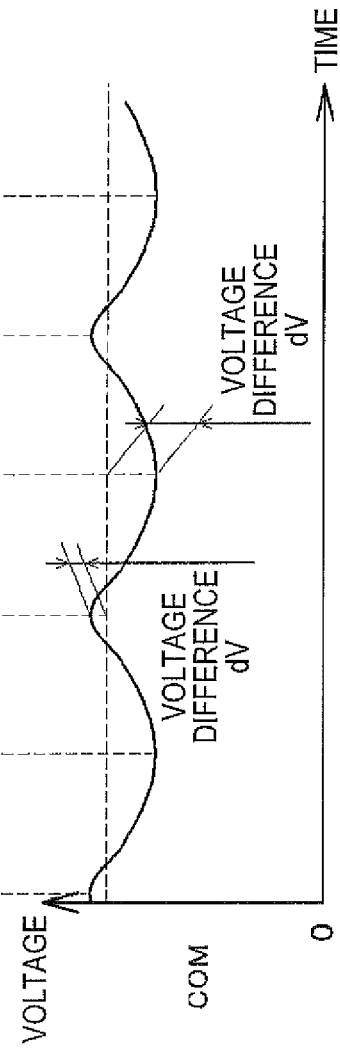

On the other hand, FIGS. 9A to 9C show a case where a period Ton is larger than half a pulse modulation period T, that is, a case where the duty ratio is larger than 50%. Even in a case where the duty ratio is larger than 50%, the inductor current is approximately linearly increased in the period (period Ton) in which the output of ACOM is the voltage Vdd, and is approximately linearly decreased in a period (period Toff) in which the output of ACOM is the voltage 0. Accordingly, when the inductor current is positive, the voltage value of COM is increased little by little, and when the inductor current is negative, the voltage value of COM is decreased little by little. As a result, the voltage value of COM becomes a voltage waveform as shown in FIG. 9C. In FIG. 9C, the voltage fluctuation is exaggerated.

Further, similarly, in a case where the duty ratio is larger than 50%, the inductor current becomes 0 at an intermediate timing in the period Ton or at an intermediate timing in the period Toff. Accordingly, at any one timing thereof, if the power amplification in the digital power amplifier 240 is stopped, it is possible to maintain COM at the voltage value at that time. Further, the difference dV between the voltage value of the maintained COM and a voltage value which is a target designated by WCOM becomes small when the power amplification is stopped in the period Toff, in a case where the duty ratio is larger than 50%. Accordingly, from the viewpoint that COM is output with high accuracy, in a case where the duty ratio is larger than 50%, it can be said that it is preferable to stop the power amplification in the digital power amplifier 240 at the timing when half the period Toff elapses.

According to the above-described phenomenon, the capacitive load drive circuit 200 according to the present embodiment outputs the enabling signal from the controller 214 of the drive waveform signal generation circuit 210 toward the gate driver 242 of the digital power amplifier 240. As a result, in the period in which WCOM is not changed, it is possible to stop the power amplification in the digital power amplifier 240 without change in the voltage of COM. Hereinafter, the process of outputting the enabling signal by the controller 214 of the drive waveform signal generation circuit 210 will be described.

C. Enabling Signal Output Process

Figure 10:
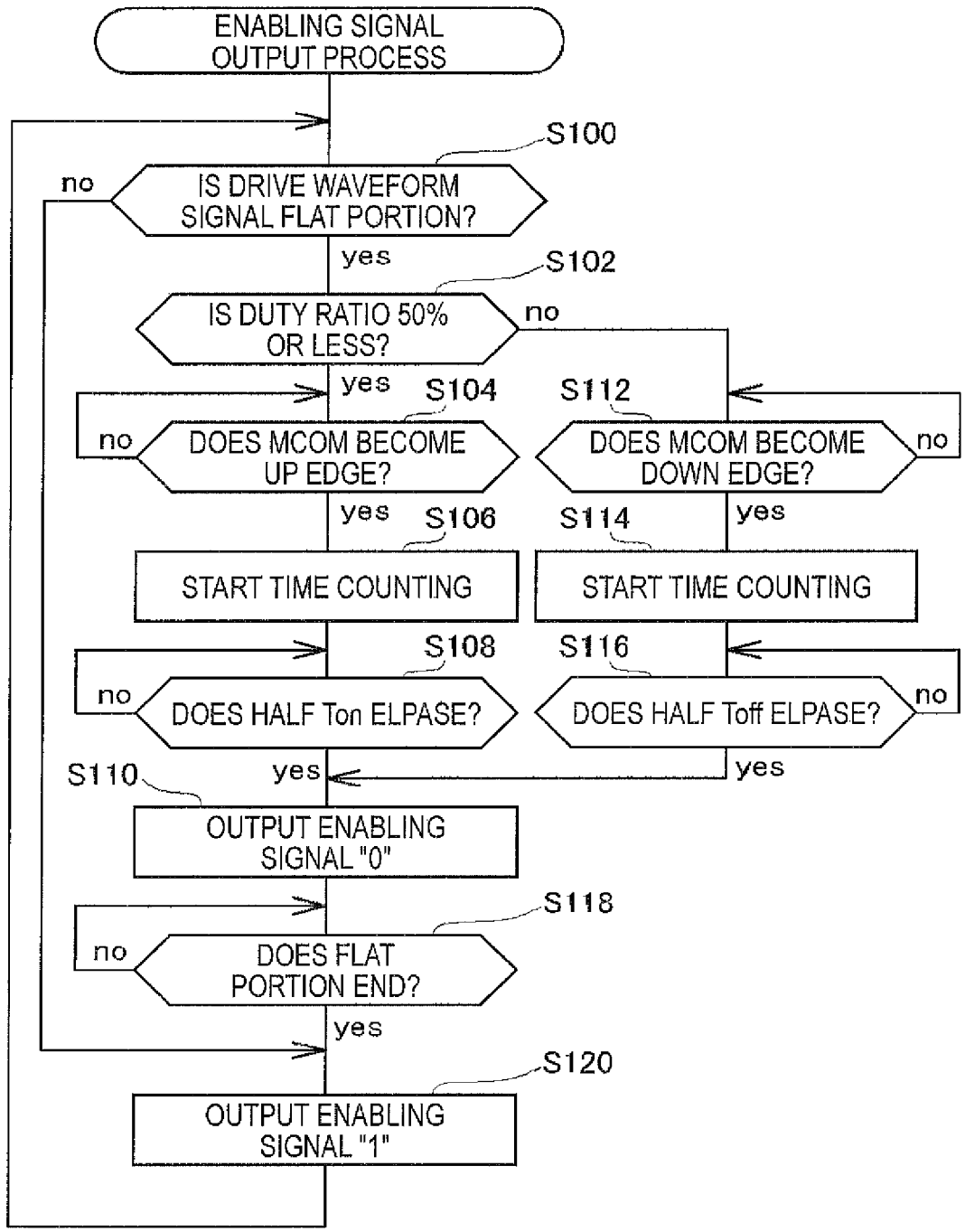
FIG. 10 is a flowchart illustrating a process of outputting an enabling signal necessary when a controller of an embodiment of the invention controls start or stop of a power amplification operation in a digital power amplifier.

FIG. 10 is a flowchart illustrating an enabling signal output process performed necessarily when the controller 214 of the drive waveform signal generation circuit 210 according to the present embodiment outputs the enabling signal. In the enabling signal output process, firstly, it is determined whether WCOM is a flat portion (step S100). That is, as described with reference to FIG. 3, the controller 214 of the drive waveform signal generation circuit 210 reads data about WCOM from the waveform memory 216 to supply the data to the DA converter 212, to thereby output WCOM. Accordingly, the controller 214 can determine whether WCOM to be output from now on is a flat portion (portion where a data value is not changed). For example, the controller 214 can read WCOM data supplied to the DA converter 212 at the moment and data to be supplied for a constant period thereafter and compares these data, to thereby determine whether WCOM is in a flat portion or not. Alternatively, a flag indicating whether WCOM is in a flat portion may be set in WCOM data stored in the waveform memory 216, and it may be determined whether WCOM is in a flat portion on the basis of the flag setting.

As a result, in a case where it is determined that WCOM is not in a flat portion (step S100, no), an enabling signal "1" is output to the gate driver 242 of the digital power amplifier 240 (step S120). Here, the enabling signal "1" is a signal for enabling the power amplification in the digital power amplifier 240. In a period in which the enabling signal "1" is received, the gate driver 242 of the digital power amplifier 240 switches the gate signals GP and GN according to MCOM, as described above with reference to FIGS. 4A to 4C, to thereby perform the power amplification of MCOM.

On the other hand, in a case where it is determined whether WCOM is the flat portion (step S100, yes), it is determined whether the duty ratio of MCOM is 50% or less (step S102). Here, the duty ratio means the ratio of the time occupied by the period (period Ton) in which the output of MCOM becomes "1" to the pulse modulation cycle T. As described above, since MCOM is generated by comparing WCOM from the drive waveform signal generation circuit 210 with the triangle wave in the modulator 230, if the voltage value of WCOM is determined, it is possible to calculate the duty ratio of MCOM.

As a result, in a case where the duty ratio of MCOM is 50% or less (step S102, yes), it is determined whether MCOM becomes an up edge (step S104). Here, an up edge of MCOM means that the output of MCOM is switched to "1" from "0". Further, as shown in FIG. 3, since MCOM output from the modulator 230 is also input to the controller 214, the controller 214 can directly detect that MCOM becomes an up edge. As a result, in a case where it is determined that MCOM is not an up edge (step S104, no), the controller 214 waits until MCOM becomes an up edge while repeating the same determination. Since the output thereof is switched to "1" from "0" in a short time during waiting as the output of MCOM is repeated between "0" and "1", it is determined that MCOM becomes an up edge (step S104, yes), and time counting in a timer built-in the controller 214 is started (step S106).

If the time counting in the timer is started, subsequently, it is determined whether half the time of the period Ton elapses (step S108). The time of the period Ton can be calculated by multiplying the duty ratio calculated in step S102 by the pulse modulation cycle T. Since half the time of the period Ton does not elapse immediately after the up edge of MCOM is detected (step S104, yes) to start the time counting, the determination in step S108 becomes "no", but while such a determination is repeated, half the time of the period Ton elapses in a short time, and thus, the determination in step S108 becomes "yes". Then, the controller 214 outputs the enabling signal "0" to the gate driver 242 of the digital power amplifier 240 (step S110). Here, the enabling signal "0" is a signal for inhibiting (stopping) the power amplification in the digital power amplifier 240. The gate driver 242 of the digital power amplifier 240 sets the outputs of the gate signals GP and GN to "0" regardless of the output of MCOM, during the period when the enabling signal "0" is received. As a result, both of the switch elements TrP and TrN are in the OFF state, and thus, the power amplification in the digital power amplifier 240 is stopped.

Hereinbefore, a case where the duty ratio of MCOM is 50% or less (step S102, yes) has been described. On the other hand, in a case where the duty ratio of MCOM is larger than 50% (step S102, no), it is determined whether MCOM becomes a down edge (step S112). Here, a down edge of MCOM means that the output of MCOM is switched to "0" from "1". That is, in a case where the duty ratio of MCOM is 50% or less, an up edge of MCOM is detected, but in a case where the duty ratio of MCOM is larger than 50%, the down edge thereof is detected. As a result, it is determined that MCOM does not become a down edge (step S112, no), the controller 214 waits until MCOM becomes the down edge while repeating the same determination. Then, if the output of MCOM is switched to "0" from "1", it is determined that MCOM becomes the down edge (step S112, yes), the time counting in the timer built-in the controller 214 is started (step S114).

If the time counting in the timer is started, subsequently, it is determined whether half the time of the period Toff elapses (step S116). The time of the period Toff is a time obtained by subtracting the time of period Ton from the pulse modulation cycle T. Accordingly, it is possible to easily perform the calculation from the duty ratio obtained in step S102. As a result, in a case where half the time of the period Toff does not elapse (step S116, no), the controller 214 is in the waiting state as it is while repeating the same determination. Then, since half the time of the period Toff elapses in a short time, the controller 214 performs determination of "yes" in step S116, and outputs the enabling signal "0" for stopping the power amplification in the digital power amplifier 240 to the gate driver 242 (step S110).

As described above, if the enabling signal "0" is output (step S110) and the power amplification in the digital power amplifier 240 is stopped, it is determined whether the flat portion of WCOM ends (step S118). In a case where the flat portion is maintained (step S118, no), the same determination is repeated until the flat portion ends, while supplying WCOM read from the waveform memory 216 to the DA converter 212. Further, if the flat portion ends (step S118, yes), the enabling signal "1" for allowing the power amplification is output to the gate driver 242 of the digital power amplifier 240 (step S120). Then, the gate driver 242 switches the outputs of the gate signals GP and GN according to MCOM again, and thus, the power amplification in the digital power amplifier 240 is restarted. If the power amplification is restarted in this way, the controller 214 of the drive waveform signal generation circuit 210 returns to the beginning of the enabling signal output process in FIG. 10 and repeats the series of processes as described above.

Figures 11, 12:
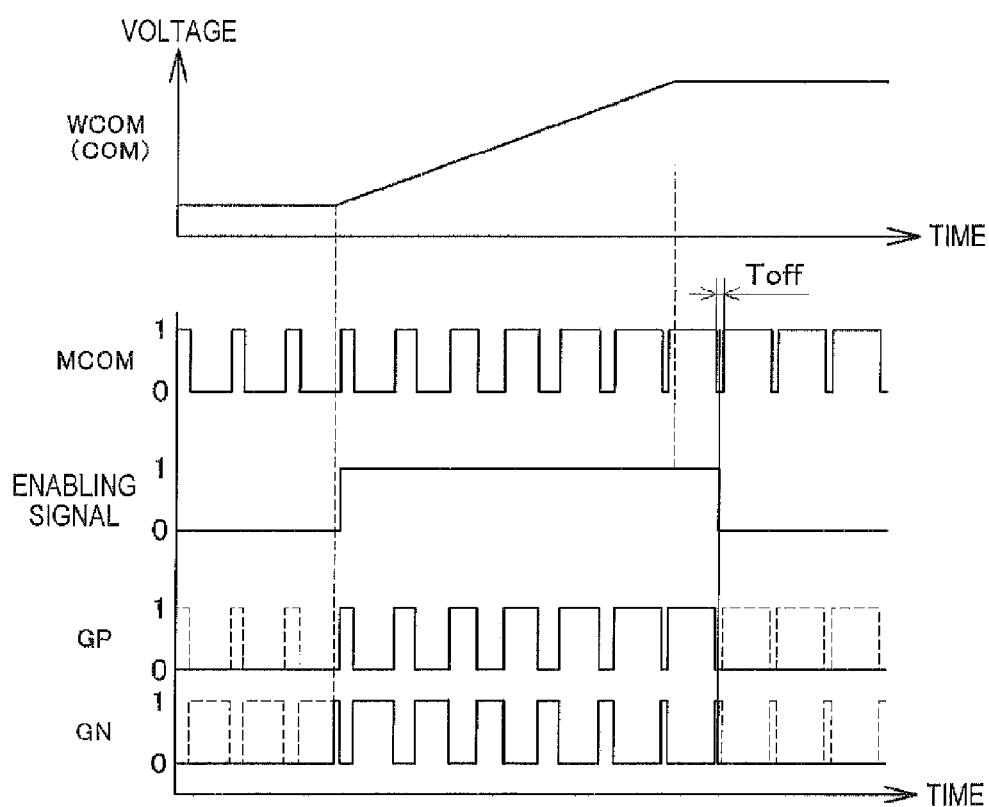
FIG. 11 is a diagram illustrating a state where a gate driver of a digital power amplifier starts or stops a power amplification operation on the basis of a modulated signal or an enabling signal.
FIG. 12 is a diagram illustrating a state where a digital power amplifier of an embodiment of the invention stops a power amplification operation in a signal invariable period.

FIG. 11 is a diagram illustrating a state where the gate driver 242 receives the enabling signal from the controller 214 to switch the outputs of the gate signals GP and GN. As shown in the figure, in a case where the output of the enabling signal is "1", the outputs of the gate signals GP and GN are switched according to the output of MCOM. As a result, the power amplification is performed in the digital power amplifier 240. On the other hand, if the output of the enabling signal becomes "0", the outputs of the gate signals GP and GN become constantly "0" regardless of the output of MCOM. As a result, the switch elements TrP and TrN are constantly in the OFF state, and thus, the power amplification in the digital power amplifier 240 is stopped.

FIG. 12 is a diagram illustrating a state where the gate driver 242 according to the present embodiment switches the outputs of the gate signals GP and GN on the basis of MCOM and the enabling signal. For example, in a period in which WCOM is maintained as a relatively small constant value (value in which the duty ratio of MCOM is 50% or less), the output of the enabling signal is set to "0". Thus, while the output of MCOM is being alternately repeated between "0" and "1", the outputs of the gate signals GP and GN are all set to "0". Accordingly, the power amplification in the digital power amplifier 240 is not performed.

Thereafter, if WCOM starts to be increased, the output of the enabling signal is immediately switched to "1" from "0". As a result, the gate signals GP and GN are output on the basis of the correspondence relationship shown in FIG. 11, according to the output of MCOM at that time. For example, if MCOM is "0" at the time when the enabling signal is switched to "1", the output of the gate signal GP becomes "0" and the output of the gate signal GN becomes "1". Further, the switch elements TrP and TrN are switched between ON and OFF according to the outputs of the gate signals GP and GN, and thus, the power amplification in the digital power amplifier 240 is performed.

When WCOM is increased while the power amplification is performed as described above, even though WCOM maintains a constant value at a relatively large value (value in which the duty ratio of MCOM is larger than 50%), the enabling signal is not immediately switched to "0" from "1" in the present embodiment, but the down edge of MCOM is firstly detected. Further, at the timing when half the time of the period Toff elapses from the down edge, the enabling signal is switched to "0" from "1". In other words, even though WCOM transits to the period (flat portion) of a constant value, until half the time of the period Toff elapses from the down edge thereafter, the power amplification in the digital power amplifier 240 is continuously performed, and the power amplification is stopped at the timing when half the time of the period Toff elapses from the down edge.

In this way, while preventing the power fluctuation as shown in FIG. 5 from occurring in COM, it is possible to stop the power amplification in the digital power amplifier 240. That is, as described with reference to FIG. 7, in the period in which WCOM becomes a constant value (single invariable period), the inductor current of a sawtooth shape flows in the inductor 252 of the low pass filter 250. Thus, if the switch elements TrP and TrN are all in the OFF state so as to stop the power amplification in the digital power amplifier 240, the voltage fluctuation due to the self induction phenomenon of the inductor 252 occurs in COM. However, at the timing when half the period in which MCOM becomes "1" (period Ton) elapses or at the timing when half the period in which MCOM becomes "0" (period Toff) elapses, the inductor current I becomes "0". Accordingly, if the switch elements TrP and TrN are all in the OFF state at any timing thereof (or in the vicinity of the timing), since the inductor current I is set to "0" or flows little, the voltage fluctuation due to the self induction phenomenon of the inductor 252 does not occur in COM. As a result, it is possible to stop the power amplification which is wastefully performed by the digital power amplifier, to thereby further reduce power loss without decrease in the drive accuracy of the capacitive load such as a piezoelectric element 104.

Further, as shown in FIGS. 8A to 8C and FIGS. 9A to 9C, in a case where the duty ratio of MCOM is 50% or less, the voltage difference dV becomes small when the power amplification is stopped at the timing when half the period Ton elapses, compared with a case where the power amplification is stopped at the timing when half the period Toff elapses. Contrarily, in a case where the duty ratio of MCOM is larger than 50%, the voltage difference dV becomes small when the power amplification is stopped at the timing when half the period Toff elapses, compared with a case where the power amplification is stopped at the timing when half the period Ton elapses. In the example shown in FIG. 12, since WCOM transits to the period in which the value of WCOM is a constant value (signal invariable period) under the condition that the duty ratio of MCOM is larger than 50%, the enabling signal is set to "0" at the timing when half the period Toff elapses, to thereby stop the power amplification. Accordingly, in a case where WCOM transits to the signal invariable period under the condition that the duty ratio of MCOM is 50% or less, the enabling signal may be set to "0" at the timing when half the period Ton elapses to stop the power amplification. Accordingly, it is possible to reduce the difference between the voltage of COM maintained in the signal invariable period and the voltage indicated by WCOM, as well as stopping the power amplification in the signal invariable period.

Hereinbefore, the capacitive load drive circuit of the present embodiment has been described, but the invention is not limited thereto and may have a variety of modifications in a range without departing from the spirit of the invention. For example, the capacitive load drive circuit of the present embodiment may be applied to a variety of electronic devices including a medical device such as a fluid ejection device used for forming microcapsules which contain chemicals or nutrients.

This application claims priority to Japanese Patent Application No. 2011-059041, filed on Mar. 17, 2011, the entirety of which is hereby incorporated by reference.

What is claimed is:

1. A capacitive load drive circuit which applies a predetermined drive signal to drive a capacitive load, comprising:
   a drive waveform generator which generates a drive waveform signal which becomes a reference of the drive signal,
   a modulator which pulse-modulates the drive waveform signal to generate a modulated signal in which a first voltage state and a second voltage state which is lower in voltage than the first voltage state are repeated;
   a digital power amplifier which power-amplifies the modulated signal to generate a power-amplified modulated signal;
   a low pass filter which smoothes the power-amplified modulated signal and generate the drive signal to be applied to the capacitive load; and
   a power amplification stopping section which stops operation of the digital power amplifier;
   a time counter which counts at least one of the elapsed time of the first voltage state and the elapsed time of the second voltage state of the modulated signal;
   the power amplification stopping section, while a voltage level of the drive signal is maintained to be constant, stops the operation of the digital power amplifier either at a timing when the elapsed time of the first voltage state of the modulated signal reaches a predetermined time, or at a timing when the elapsed time of the second voltage state of the modulated signal reaches a predetermined time.

2. The capacitive load drive circuit according to claim 1,
wherein the power amplifier stops the operation of the digital power amplifier at a timing when the elapsed time of the first voltage state of the modulated signal reaches a predetermined time, as long as the elapsed time of the first voltage state of the modulated signal is shorter than the elapsed time of the second voltage state,
wherein the power amplifier stops the operation of the digital power amplifier at a timing when the elapsed time of the second state of the modulated signal reaches a predetermined time, as long as the elapsed time of the second voltage state of the modulated signal is shorter than the elapsed time of the first voltage state.

3. The capacitive load drive circuit according to claim 2,
the power amplification stopping section stops the operation of the digital power amplifier at a timing when half a period of time which the modulated signal maintains the first voltage state passed as long as the elapsed time of the first voltage state of the modulated signal is shorter than the elapsed time of the second voltage state,
the power amplification stopping section stops the operation of the digital power amplifier at a timing when half a period of time which the modulated signal maintains the second voltage state passed as long as the elapsed time of the second voltage state of the modulated signal is shorter than the elapsed time of the first voltage state.

4. A liquid ejection device including the capacitive load drive circuit according to claim 2.

5. A liquid ejection device including the capacitive load drive circuit according to claim 1.

* * * * *